(12) United States Patent
Quenzer et al.

(10) Patent No.: US 7,416,961 B2
(45) Date of Patent: *Aug. 26, 2008

(54) METHOD FOR STRUCTURING A FLAT SUBSTRATE CONSISTING OF A GLASS-TYPE MATERIAL

(75) Inventors: Hans-Joachim Quenzer, Itzehoe (DE); Arne Veit Schulz, Hamburg (DE); Bernd Wagner, Looft (DE); Peter Merz, Hanerau-Hademarschen (DE)

(73) Assignee: Fraunhofer-Gesellschaft zur Förderung der Angewandten Forschung e.V., München (DE)

( * ) Notice: Subject to any disclaimer, the term of this patent is extended or adjusted under 35 U.S.C. 154(b) by 628 days.

This patent is subject to a terminal disclaimer.

(21) Appl. No.: 10/471,581

(22) PCT Filed: Mar. 13, 2002

(86) PCT No.: PCT/EP02/02796

§ 371 (c)(1),
(2), (4) Date: May 10, 2004

(87) PCT Pub. No.: WO02/073684

PCT Pub. Date: Sep. 19, 2002

(65) Prior Publication Data

US 2004/0180517 A1    Sep. 16, 2004

(30) Foreign Application Priority Data

Mar. 14, 2001 (DE) ................. 101 12 612
Apr. 14, 2001 (DE) ................. 101 18 529

(51) Int. Cl.
*H01L 21/00* (2006.01)
(52) U.S. Cl. ................. 438/458; 257/E21.214

(58) Field of Classification Search ............ 438/405, 438/406, 455, 456, 458, 460, 464
See application file for complete search history.

(56) References Cited

U.S. PATENT DOCUMENTS 6,303,462 B1 * 10/2001 Gidon .................. 438/406

(Continued)

FOREIGN PATENT DOCUMENTS

DE           41 26 877 C1        8/1991

(Continued)

*Primary Examiner*—Scott B. Geyer
*Assistant Examiner*—Reema Patel
(74) *Attorney, Agent, or Firm*—Antonelli, Terry, Stout & Kraus, LLP.

(57) ABSTRACT

Disclosed is a method for structuring a flat substrate consisting of a glass-type material. The invented method is distinguished by a combination of the following steps:
providing a semiconductor flat substrate consisting of a semiconductor material, structuring at least one surface of said semiconductor flat substrate to obtain recesses in said surface, connecting said surface of said semiconductor flat substrate to said glass-type flat substrate, with said structured surface of said semiconductor flat substrate being connected to a surface of said glass-type flat surface at least partially covering the same,
tempering said connected flat substrates in such a manner that at least a part of the said glass-type material flows into said recesses of said structured surface of said semiconductor flat substrate,
removing material at least from the resolidified glass-type flat substrate in such a manner that said glass-type flat substrate assumes a surface which is flush with said structured surface of said semiconductor flat substrate.

24 Claims, 2 Drawing Sheets

U.S. PATENT DOCUMENTS

| | | | |
|---|---|---|---|
| 7,259,080 B2 * | 8/2007 | Quenzer et al. | 438/455 |
| 2001/0011675 A1 * | 8/2001 | Hacke et al. | 228/246 |
| 2004/0180517 A1 * | 9/2004 | Quenzer et al. | 438/479 |

FOREIGN PATENT DOCUMENTS

| | | |
|---|---|---|
| DE | 43 07 869 A1 | 9/1994 |
| WO | WO97/19027 | 5/1997 |

* cited by examiner

METHOD FOR STRUCTURING A FLAT SUBSTRATE CONSISTING OF A GLASS-TYPE MATERIAL

BACKGROUND OF THE INVENTION

1. Field of the Invention

The present invention relates to a method for structuring a flat substrate consisting of a glass-type material.

2. Description of the Prior Art

As a material in modern microelectronics or micro-mechanics, glass or glass-type materials have numerous advantages over other materials, in particular over plastics, with regard to their low thermal expansion coefficients, which compare to those of semiconductor materials, and moreover they possess great mechanical and chemical stability. As a result these materials have acquired considerable significance in many technical fields.

However, there are major limitations in the production especially of technically interesting products, in particular of micro-mechanical and microelectronic components of glass as hitherto there are only less suited etching processes available for micro-structuring glass. Consequently, presently only mechanical processes such as sawing, grinding, polishing, scratching, ultrasound or sand blasting are employed. As a result, the structuring possibilities of glass are greatly limited. With these conventional processing methods, however, it is impossible to structure glass in the micrometer and, in particular, in the sub-micrometer range with the necessary precision required in semiconductor component technology.

Due to these major structuring limitations, plastic is used in all presently known methods to fabricate micro-structural bodies. For instance, DE 43 07 869 A1 describes a method in which the micro-structural body is molded in plastic or in sinter materials by means of a mold insert. The micro-structured mold insert is made of a solid body consisting of metal, ceramic, glass, stone or mono-crystalline material by means of fine precision mechanical processing, additive or substractive structuring. Then the mold insert is filled with a free-flowing material, covered and after hardening, the material is separated from the mold insert. The micro-structural body fabricated in this manner has, however, also the drawback that it is made of a material which has a high thermal expansion coefficient and possesses, compared to glass-type materials, little mechanical and chemical stability.

WO 97/19027 A1 describes a base substrate with a trough structure into which the biological sample material is placed and a method for the production thereof. In order to structure the base substrate, it is heated in such a manner that it can be easily molded and upon reaching the required temperature, a stamp unit, which consists of a non-deformable material, is applied to the base substrate. Then the base substrate is cooled and the stamp unit is removed. Although base substrates of glass-type materials can also be molded with the method described here, a combination of arbitrary regions of glass and of silicon on one and the same support, according to the locally required properties, cannot be obtained with this method either.

A breakthrough regarding the technical limitations of working with glass would open new fields of application in which composite materials of silicon and glass would play a major role. Such composite elements could exploit the complementary properties of both materials. For example, compared to silicon, glass possesses very low electric and thermal conductivity but, contrary to silicon, is optically transparent in the visible wavelength range.

Moreover, in addition to silicon, glass or glass-type materials play an important role in the realization of micro-mechanical components. In particular, with regard to encapsulating components, glass is often employed as an electrically insulating material. But here too, micro-structuring faces the above described limitations.

With the prior art methods, it is impossible to produce an intimate structure made of a semiconductor, for example silicon and glass, whose geometry can be freely dimensioned laterally in the micro range and sub-micro range. However, this would be desirable in order to be able to combine arbitrary regions of glass and silicon on one and the same support and, in particular, in order to dimension them according to the locally required properties.

SUMMARY OF THE INVENTION

The present invention provides a method for structuring a flat substrate consisting of a glass-type material in such a manner that almost any desired structuring of glass or glass-type materials, preferably in the form of a flat substrate having structural dimensions in the micro range and sub-micro range, can be carried out. In particular, the material glass should acquire equal significance in microelectronics and in micro-mechanics with regard to processability and range of use as semiconductor materials. The method should permit precise and as cost-effective as possible production of glass-type flat substrates structured in this manner. Moreover, the method should permit contacting semiconductor substrates and glass-type flat substrates intimately and to structure them in composite form in a desired manner.

The method of the invention utilizes conventional form-giving methods employed in semiconductor processing. For instance, form-giving methods, in particular, for mono-crystalline silicon are common in semiconductor technology and are a standard method. Combining lithographic processes with wet-chemical isotropic and anisotropic etching processes and various dry etching processes yields a large number of production possibilities of practically random structured silicon surfaces. Mass use in semiconductor technology renders these cost effective.

The method applies the structuring methods of the invention successfully employed in semiconductor technology also to glass or glass-type materials. The method comprises the following process steps:

First a semiconductor flat substrate consisting of a semiconductor material is provided, for example in the form of a silicon wafer, which is structured in a subsequent step using prior art methods. For instance, digital or continuous structures are transferred into a photosensitive varnish applied to a silicon substrate, preferably a mono-crystalline wafer, by means of conventional lithographic processes. Contact exposure or projection exposure, which are conventional in the semiconductor industry, offer standard methods of transferring digital structures. As a result, even almost randomly shaped surfaces can be imaged with the aid of gray-tone lithography. Following exposure, the unexposed varnish volume is removed in a developer. The topography of the varnish is transferred into the silicon by means of etching processes. Possible etching processes are wet chemical etching processes (KOH processes) as well as, in particular, plasma etching processes (plasma etch, reactive ion etch (RIE)). Both processes also permit producing relatively deep structures with structural dimensions in the sub-micrometer range.

Then the surface of the semiconductor flat substrate is intimately connected to a glass-type flat substrate, and the structured surface of the semiconductor flat substrate is connected to a surface of the glass-type flat substrate at least partially covering the same. Anodic bonding is especially suited for firm, intimate connection of the two flat substrates, yielding a hermetically tight bond between the two flat surfaces.

Anodic bonding in which two highly flat substrates, usually comprising a metal substrate and an insulator substrate, are heated on a so-called "hot plate" which has been known since the late 1960s. As previously described, semiconductor substrate and the glass-type substrate are connected. In addition, a voltage of up to 1000 V is applied between the two flat substrates. If the negative pole is located at the glass-type substrate, the positive, mobile ions in the glass matrix move in the direction of the cathode. The immobile, and thus stationary oxygen ions form a negative space charge region at the boundary to the semiconductor. On the one hand, the resulting electrostatic force renders a close contact between the two substrate surfaces. On the other hand, the strong electric fields at the interface between the semiconductor flat substrate, for example a silicon wafer, and the glass releases an electrochemical reaction in the course of which an oxide is formed at the interface. This oxide connects the two substrates.

In anodic bonding of silicon and glass, boron silicate glass (Pyrex™, Borofloat™), which is largely adapted to silicon in the thermal expansion coefficient, is employed as the glass-type flat substrate. However, in this method, the two materials present in disk form are stacked on top of each other (singly or multiply).

Now the actual structure transfer step from the pre-structured semiconductor flat substrate onto the glass-type flat substrate occurs by tempering the bonded flat substrates. In the course of a furnace based process in which the glass-type material is heated to a plastic range above the glass temperature $T_G$, the glass material fills the structural openings respectively the recesses in the semiconductor flat substrate. After corresponding cooling of the two intimately bonded flat substrates, whose thermal expansion coefficients are comparable or even identical, due to which only minimal or no thermal tension occurs, the glass-type flat substrate bears the flat semiconductor structure in a negative form.

Then the surface of the glass-type flat substrate is ground down to the pre-structured semiconductor surface and polished, for example by chemo-mechanical polishing, in such a manner that after completion of this processing step a composite flat substrate is produced in which the glass or the glass-type material is formed with structural dimensions that were hitherto only possible with semiconductor materials, in particular mono-crystalline silicon.

In further advantageous processing steps, the rear side of the semiconductor flat substrate is now processed in that excess semiconductor material, for example silicon, is also removed by grinding and polishing. In this manner, a substrate is produced which in some regions consists of semiconductor material and in others of glass-type material.

Moreover, the semiconductor material can be removed in a further etching process, for example, to obtain narrow holes or breakthroughs in the glass substrate. Further mechanical grinding and polishing steps may follow in order to be able to open the breakthroughs precisely, respectively to obtain corresponding opening contours.

By exploiting the flow properties of glass in a heated state, the surface topography can be exactly transferred from a structured semiconductor flat substrate, for example in the form of a silicon master, into glass-type materials, thereby yielding considerable advantages for production as well as in precision. For instance, the advantages of silicon technology (exact form-giving process down to the sub-µm range, manifold structuring possibilities) can be combined with the good material properties of glass.

If the structural height of the original semiconductor flat substrate is great enough and copied completely in the glass-type flat substrate using a suited glass flow process, regions can be created that extend completely through the new composite substrate. Depending on the areal distribution, glass wafers with silicon ducts or silicon wafers with glass windows can be created in this manner.

A particularly important aspect herein is very good thermal compatibility of the two materials, for example silicon and glass (boron silicate glasses such as Pyrex®, Tempax® or Borofloat glass). The almost perfect match of the thermal expansion coefficients of silicon and Pyrex® glass permits producing a thermally homogeneous substrate. In particular, no effects occur arising from thermally induced stress, such as for example a tendency of the substrate to crack or deform.

The thickness of the two substrates is usually between 0.1 mm and 1 mm. It should be noted that the lateral geometry of the segmentation of the semiconductor flat substrate and glass-type flat substrate is basically not subject to any limitations. The regions of different materials can be continuous or not continuous. The minimum dimensions of the regions depend on the precision of the primary semiconductor structuring method and the mechanical stability of the wafer or chip. With anistropic dry etching ("deep RIE"), an aspect ratio (height:width) of 10:1 in the silicon structures can be obtained, thus creating for example breakthroughs or holes with a diameter of 50 µm in a glass wafer with a thickness of 500 µm. However, the finest glass structures may have smaller dimensions as very fine holes can be etched into silicon, for example by means of pore etching.

BRIEF DESCRIPTION OF THE DRAWINGS

The present invention is made more apparent by way of example in the following using preferred embodiments with reference to the accompanying drawings without the intention of limiting the scope or spirit of the inventive idea.

DETAILED DESCRIPTION OF THE INVENTION

Figure 1:
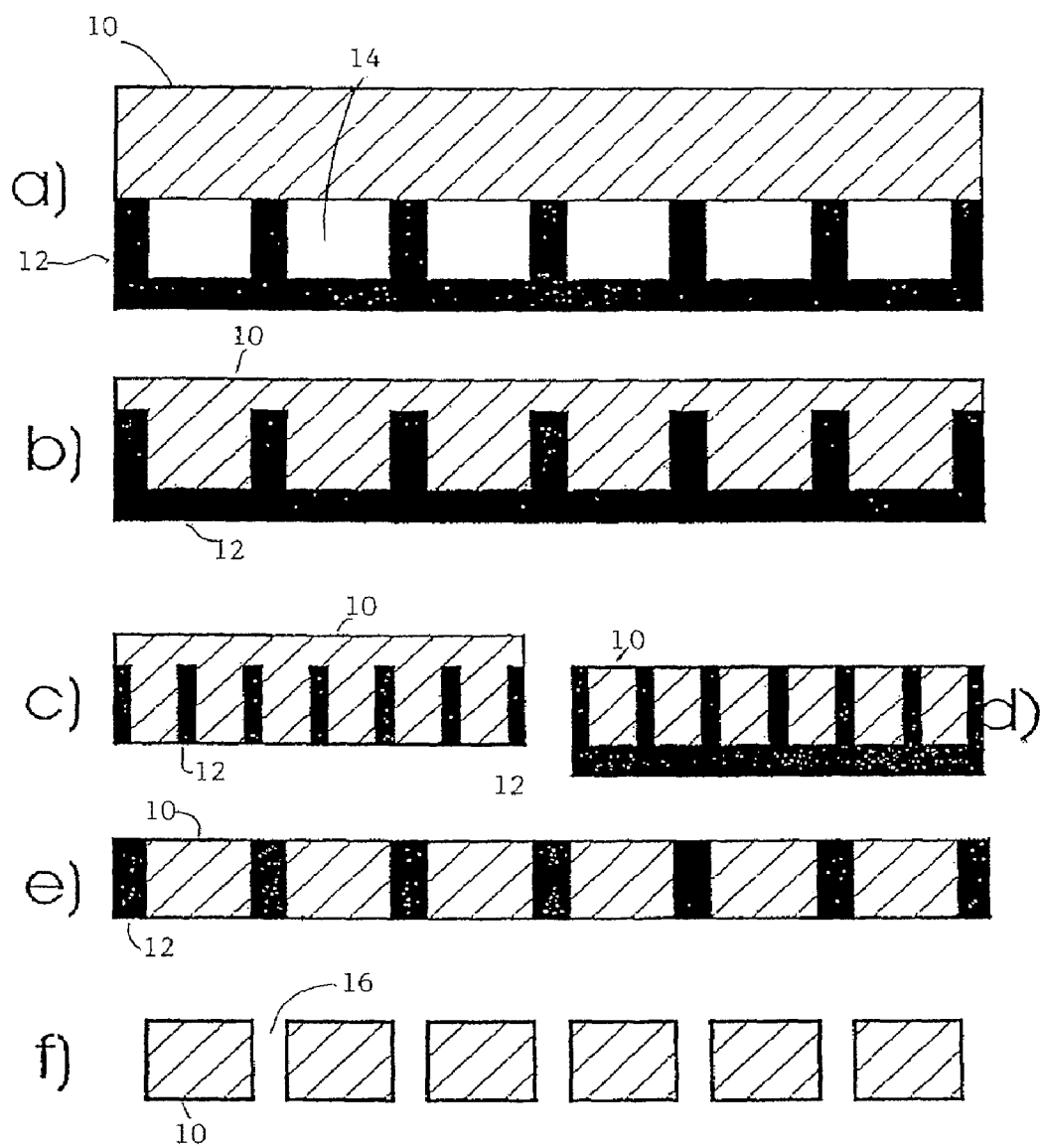
FIG. 1 shows a flow chart of a method of the invention for producing a structured glass-type flat substrate.

FIG. 1 depicts a flow chart of the steps of the present invention. FIGS. 1a to 1f show hatched flat regions which correspond to the glass-type flat substrate. The flat black regions relate to the semiconductor flat substrate, which is preferably structured in a given manner.

In FIG. 1a, the glass-type flat substrate 10 is intimately bonded onto the already pre-structured semiconductor flat substrate 12 by way of anodic bonding. In this manner the two flat substrates enclose intermediate volumes 14 given by the geometry of the recesses within the surface of the semiconductor flat substrate. Advantageously, bonding of the two flat substrates occurs under vacuum conditions in such a manner that in a subsequent tempering step (FIG. 1b) following anodic bonding according to FIG. 1a, the glass-type flat substrate 10, which is heated above the glass temperature, is completely spread into the structural openings of the pre-structured semiconductor flat substrate. The tempering step, which preferably occurs in a furnace process, is conducted under normal pressure conditions or under raised pressure conditions. Although fundamentally the driving force with which the plastic glass material is driven into the structural openings is the vacuum locked inside the structural openings, nonetheless the process can be supported by the respective overpressure conditions present inside the tempering furnace. However, at constant temperature and with a corresponding process time, the material properties of the glass-type flat substrate exercise decisive influence on the distinctiveness and the precision of the structural formation.

Following corresponding cooling of the two now intimately interlocking flat substrates, material is removed using suitable grinding and/or polishing methods. Depending on the subsequent manner of application of FIG. 1c, the semiconductor flat substrate is removed from below in such a manner that a glass-type flat substrate is created containing as finely as possible structured semi-conductor regions or the glass-type flat substrate is removed from above according to the process step of FIG. 1d in such a manner that the glass-type flat surface is flush with the structured surface of the semiconductor flat surface.

Finally, FIG. 1e shows the result of another material removal process which removes parts of the respective flat substrate projecting beyond the structured regions (See FIGS. 1c, 1d). At this stage a very finely structured glass-type flat substrate is produced which is completely penetrated by a multiplicity of semiconductor breakthroughs. Such a type composite component can, as will be explained in the following, be utilized for electrical contacting of microelectronic components.

FIG. 1f shows a glass-type flat substrate provided with perforations 16 respectively complete breakthroughs yielded following an etching process in which the semiconductor material regions shown in FIG. 1e have been removed.

As an alternative to complete removal of the structured semiconductor flat substrate by way of the etching process indicated in FIG. 1f, the two flat substrates can also be completely separated, for example after cooling following the tempering step, in that a suitable separating layer is placed between the two flat substrates. In this way, by placing suited separating layers, reuse of the pre-structured semiconductor flat substrate can be realized, which permits reducing process costs considerably. For this purpose, it is necessary that, prior to connecting the two flat substrates, one or a plurality of separating layers are placed between the two flat substrates. Fundamentally, there are several possible ways of doing this:

a) A carbon coating (also diamond or diamond-like, SiC) which prevents the glass from adhering to the silicon is applied onto the semiconductor flat substrate, for example a silicon wafer. Connection of the silicon wafer and the glass wafer is for example a silicon wafer. Connection of the silicon wafer and the glass wafer is achieved by means of a solder ring which connects the two vacuum-tight wafers at the wafer edge. Although the solder becomes fluid at the process temperature at which glass flows, the poor wetting of the uncoated glass and the carbon coatings, however prevents the solder from penetrating between the wafers. Separation of the two wafers can occur either purely mechanically or the solder ring can also be removed by means of etching or the carbon coating can be removed by means of an oxidation process (approximately 400-500° C.) between the two substrates. Before further use of the silicon wafer, these coatings, may have to be reapplied.

b) An adhesion promoting coating consisting of a suited metal, for example tantalum, is applied to the silicon wafer. Another metal, for example tin, is applied onto this coating. Tin also prevents the glass from sticking to the silicon and is fluid during the glass flow process. Separation of the two wafers can occur either purely mechanically in an additional tempering step above the melting point of tin or the metal is etched away selectively in relation to the silicon and the glass.

c) A second coating, with which the glass wafer is directly connected (for example by means of anodic bonding), is applied onto the silicon wafer. Examples are, silicon, titanium, aluminum, or tantalum. At the end of the entire process, this sacrificial coat is removed selectively in relation to the glass or the silicon by etching. In order to prevent the original silicon wafer from being attacked, the wafer can also be provided with suited coatings, for example silicon nitride or silicon carbide.

With suitable separating layers, the production process can be modified in such a manner that the silicon wafer can be reused multiple times. Under circumstances, the separating layers have to be reapplied before renewed use. Finally, the structured glass wafer provided after removal of the silicon wafer only needs to be polished from the rear side to obtain complete breakthroughs. These breakthroughs can be filled in a further process, for example galvanically with metals.

In microelectronics and micro-systems technology, electrical contacting generally occurs via pads lying at the edge of the chips. In a number of applications, however, this has drawbacks and therefore is undesirable. For example for electrical reasons, in order to reduce signal losses, for example in the case of small capacity signals or in the case of high-frequency signals. The electrical duct offers lower serial resistance, lower scatter capacities and lower inductivities than contacting via the edge.

for space reasons. This applies in, particular, to systems that have to be assembled seamlessly in an array of a plurality of chips, for example large surface detector arrays or micro-mirror arrays. In these cases, the pad region must be forfeited on the inner chips. Often there are also space problems in single components, for example in medical microprobes (electrodes for stimulation or registration).

if a plurality of functional chips are placed on top of each other and form a stack. For example, the top level can consist of sensors (for example optical) and the signal processing electronics can lie in the chip below.

Sample cards consist of micro-contact arrays for automated electrical testing of chips, wafers or printed boards. In this case, through contacting is desired for electrical reasons and in the case of large sample cards also for space reasons.

In these cases, through contacting through the chip is an alternative which is possible with the glass substrate processed in the invented manner.

Figure 2:
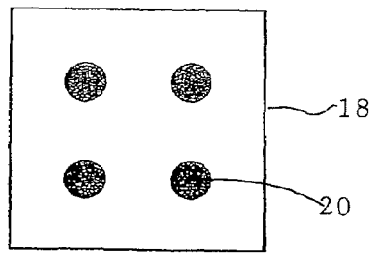
FIG. 2 shows a top view of a glass-type flat substrate with electrical ducts.

FIG. 2 shows a diagrammatic top view of a processed glass wafer 18 (white area) interspersed with electrical contacts 20 (black area). Such a type structure is provided in the process step according to FIG. 1e. The electrical contacts through the glass wafer can consist of high-conducting silicon (processed without separating layer) or of metals (processed with separating layer and subsequent plating-up of the free breakthroughs inside the glass wafer).

Figure 3:
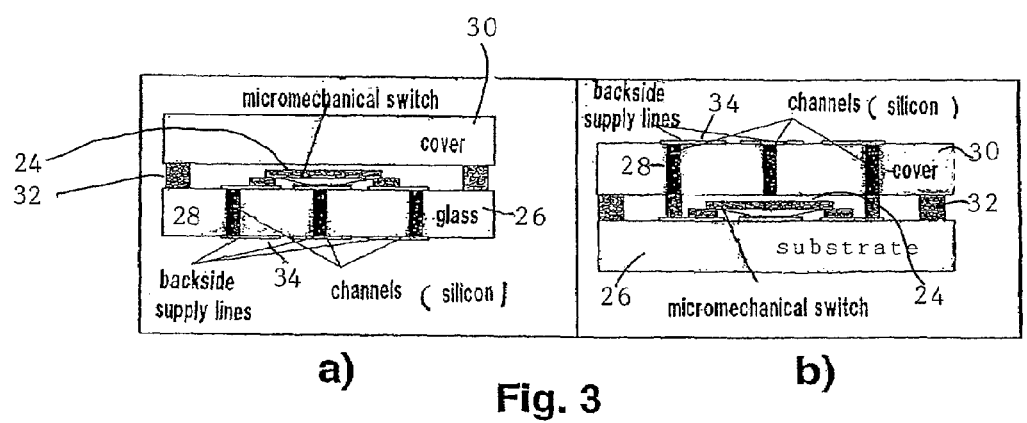
FIGS. 3a and b show examples of applications of a processed glass-type flat substrate.

Especially advantageous is using substrates structured in this manner for setting up micro-mechanical components for the high-frequency range 1-100 GHz. An example of this is shown in FIGS. 3a) and b). In this example, a micro-mechanical component (micro-mechanical switch 24) is set up on a glass substrate 26 with electrical ducts 28 in channels (FIG.

3a). In FIG. 3a, a cover 30 is soldered by solder 32 to the glass substrate 26 having backside supply lines 34. At the end of the entire fabrication process, the whole structure is hermetically encapsulated with a soldering process, whereby also the electrical contacts 34 to the two wafers are produced. As an alternative, the electrical contacts 34 can also be placed in the lid (FIG. 3b).

The electrical contact regions shown in FIG. 2 also serve for the selective removal of heat. Possible use is in applications in which heat has to be removed in certain regions in a glass substrate. The silicon or metal ducts, thus, serve as heat conducting paths.

Figure 4:
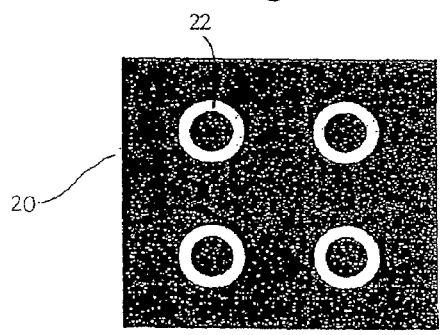
FIG. 4 shows a top view of a semiconductor flat substrate with insulated electrical ducts.

FIG. 4 shows a preferred embodiment of a silicon wafer 20 (black areas) which is provided with ring-shaped glass regions 22 (white areas) for the purpose of providing insulated electrical ducts. Such a type structure can also be obtained in a modified form as part of the process step according to FIG. 1e. This type of silicon wafers, in which glass is employed in certain regions for electrical, thermal or optical reasons, are suited for many different applications:

Silicon Wafers with Thermally Insulated Regions

Suited for these applications are the structures according to FIG. 1d or 1e. Thermally insulated regions on silicon wafers are needed in particular in thermal sensors, for example in thermopiles, bolometers or pyroelectrical sensors. Hitherto, for these types of sensors, membrane structures were generated in or on the chip in order to ensure thermal insulation. However, for reasons of stability, these sensors are not suited for use in areas subjected to high mechanical stress.

Silicon Wafers with Electrically Insulated Regions

In this case too, structures according to FIG. 1d or 1e are useable. In particular passive high-frequency components (for example inductivities) or MEMS components with a high Q-factor can be placed on the glass regions. Due to losses in the substrate, a high Q-factor cannot be attained on pure silicon substrates.

Silicon Wafers with Optical Windows

In this case, structures according to FIG. 1c or 1e can be employed. Possible uses are, for example light collimators with a special shape or collimator arrays with narrow openings.

Generally the production of hermetically tight bonding already on the wafer level is an important topic in microsystems technology. In any event, mobile microstructures have to be protected against adverse ambient conditions, in the best case still at the wafer level. Apart from the cost aspect which favors encapsulation at the wafer level, protection in necessary serialization processes plays an important role. Moreover, since hermetically tight sealing is often required, inevitably the problem of the electrical ducts below the sealing areas arises. In this context, relating to the encapsulation of microelectronic components, the method of the invention aids CSP technology (chip side packaging).

Although in the case of silicon sensors, the methods based on glass solders have proven successful, they require process temperatures of approximately 400° C. which is definitely too high, for example for metallic micro-elements. Moreover, connection methods based on glass solders is only suited for sealing a comparatively low topography (approximately 0.5 μm).

Hermetically tight connections at temperatures below 250-300° C., on the other hand, can be produced by soldering. Here, however, inevitably the problem arises that the available insulation materials and their producible thickness are largely coupled capacitively. For this reason, such ducts are actually not suitable for producing micro-mechanical components for high frequencies. Only the use of ducts through the substrate or the lid permits sufficient separation of the ducts.

Apart from the already mentioned aspects, improved handling of the complete chips also favors fabricating ducts. In particular, components built up in such a manner are also suited for use inside flip-chip processes or even for the use of chips directly in charging printed boards, for example as a SMD component.

In conclusion, it is pointed out that the method of the invention permits parallel production of a plurality of single, structured glass-type flat substrates, which moreover can be produced in a batch process, making the present method excellently suited for industrial mass production.

What is claimed is:

1. A method for structuring a glass-type flat substrate consisting of a glass-type material, comprising:
   providing a semiconductor flat substrate consisting of a semiconductor material;
   structuring at least one surface of said semiconductor flat substrate to obtain recesses in said at least one surface;
   connecting said at least one surface of said semiconductor flat substrate to said glass-type flat substrate, with said at least one structured surface of said semiconductor flat substrate being connected to and at least partially covering a surface of said glass-type flat surface;
   tempering said connected flat substrates so that at least a part of said glass-type material flows into said recesses of said structured surface of said semiconductor flat substrate; and
   removing material at least from said glass-type flat substrate after resolidification thereof so that said glass-type flat substrate assumes a surface which is flush with said structured surface of said semiconductor flat substrate; and wherein
   said connecting occurs with negative pressure within said recesses in said at least one surface of said semiconductor flat substrate and between said semiconductor flat substrate and said glass-type substrate following said connection.

2. The method according to claim 1, comprising:
   removing, at a surface of said semiconductor flat substrate opposite said surface connected to said glass-type flat substrate, semiconductor material until at least parts of the glass-type material which flowed into said recesses which are flush with said surface of said semiconductor flat substrate are exposed.

3. The method according to claim 1, wherein:
   said semiconductor flat substrate is separated from said glass-type flat substrate.

4. The method according to claim 3, wherein:
   said glass-type flat substrate is separated from said semiconductor flat substrate by etching said glass-type substrate away.

5. The method according to claim 3, wherein:
   said two flat substrates are separated by providing a separating layer between said two flat substrates.

6. The method according to claim 5, wherein:
   before connecting said two flat substrates, said separating layer is applied onto said structured surface of said semiconductor flat substrate to retain structure and is a sacrificial layer which is destroyed by thermal and/or chemical action permitting separation of said two substrates.

7. The method according to claim 5, wherein:

a metal layer, which has a melting point below the melting point of said substrates, is utilized as said separating layer.

8. The method according to claim 5, wherein:

an oxidizable layer, which changes chemically when oxygen and/or thermal energy is added, comprises said separating layer.

9. The method according to claim 5, wherein:

a carbon coating, diamond-like layer or SiC comprises said separating layer.

10. The method according to claim 1, wherein:

said glass-type material and said semiconductor material possess similar thermal expansion coefficients.

11. The method according to claim 1, wherein:

said flat substrate consisting of a glass-type material is a boron silicate glass.

12. The method according to claim 1, wherein:

said semiconductor flat substrate is a silicon substrate.

13. The method according to claim 1, wherein:

said semiconductor flat substrate is connected with said glass-type flat substrate by anodic bonding.

14. The method according to claim 1, wherein:

during said tempering, overpressure acts on the surface of said glass-type flat substrate facing away from said semiconductor flat substrate.

15. The method according to claim 1, wherein:

by controlling temperature and duration, said tempering causes flow of said glass-type material into said recesses of said semiconductor flat substrate to end when said glass-type material completely fills said recesses.

16. The method according to claim 3, wherein:

after separation of said two flat substrates, said glass-type flat substrate is finished mechanically to obtain breakthroughs penetrating vertically through said flat substrate.

17. The method according to claim 16, wherein:

said breakthroughs are filled with an electrically conducting material.

18. The method according to claim 1, wherein:

said semiconductor flat substrate is structured lithographically followed by etching to produce structural dimensions in a micrometer and/or a sub-micrometer range.

19. The method according to claim 18, wherein:

said recesses have an aspect ratio of height to width of 10:1.

20. The method according to claim 1, wherein:

said glass-type flat substrate penetrates perpendicularly to the substrate surface with breakthroughs containing electrically conducting material.

21. The method according to claim 20, comprising:

arranging said breakthroughs filled with electrically conducting material in an array-like manner.

22. The method according to claim 20 comprising:

providing electrical contact of components in microelectronics or micro-mechanics.

23. The method according to claim 1 comprising:

providing the semiconductor flat substrate interspersed with said glass-type material.

24. The method according to claim 23, wherein:

said semiconductor flat substrate is a silicon wafer;

and further comprising regions of glass-type material which at least partially penetrate said silicon wafer which provide at least one of electrical insulation, thermal insulation or optical transparency.

* * * * *